United States Patent
Susnjara

(10) Patent No.: US 6,801,218 B2
(45) Date of Patent: Oct. 5, 2004

(54) METHOD OF MODIFYING KITCHEN CABINET DESIGNS WITHIN CABINET DESIGN SOFTWARE TO ACCOMMODATE UTILITIES

(75) Inventor: Kenneth Susnjara, Birdseye, IN (US)

(73) Assignee: Thermwood Corporation, Dale, IN (US)

( * ) Notice: Subject to any disclaimer, the term of this patent is extended or adjusted under 35 U.S.C. 154(b) by 287 days.

(21) Appl. No.: 10/033,947

(22) Filed: Dec. 27, 2001

(65) Prior Publication Data

US 2003/0122852 A1 Jul. 3, 2003

(51) Int. Cl.$^7$ ................................................. G09G 5/00
(52) U.S. Cl. ...................................... 345/653; 345/964
(58) Field of Search ................................ 345/653, 961, 345/964

(56) References Cited

U.S. PATENT DOCUMENTS

| | | | | |
|---|---|---|---|---|
| 5,299,307 A | * | 3/1994 | Young | 345/861 |
| 5,590,062 A | * | 12/1996 | Nagamitsu et al. | 703/6 |
| 6,377,242 B1 | * | 4/2002 | Sweed | 345/158 |
| 2002/0089499 A1 | * | 7/2002 | Lee et al. | 345/419 |

* cited by examiner

Primary Examiner—Matthew C. Bella
Assistant Examiner—Aaron M. Richer
(74) Attorney, Agent, or Firm—Stevens, Davis, Miller & Mosher, LLP

(57) ABSTRACT

A method for designing a kitchen which automatically transfers the utility locations and required clearances in a kitchen layout to a subsequent kitchen layout when the designer makes design changes. First, the method allows a designer to input the location and clearance requirements of a utility. Cabinets are placed over the utilities and then portions of the cabinets are removed to accommodate the clearance holes. When the designer makes changes to the cabinet design, the location of the utilities as well as their clearance requirements remain as part of the layout information. When subsequent cabinets are placed in the design, portions of those cabinets are removed to accommodate the utility clearance requirements inputted earlier.

18 Claims, 3 Drawing Sheets

METHOD OF MODIFYING KITCHEN CABINET DESIGNS WITHIN CABINET DESIGN SOFTWARE TO ACCOMMODATE UTILITIES

FIELD OF THE INVENTION

The present invention relates to the field of computer based cabinet design, principally, the location of utility openings in cabinets.

BACKGROUND OF THE INVENTION

Software packages are commonly used to design kitchen cabinets and arrange those cabinet designs within a specific kitchen. Companies or individuals that build custom cabinets either for new construction or remodeling commonly use these software packages.

A typical package allows for the adjustment of many variables in the design of a cabinet including the size, number of shelves, doors, drawers, etc. These packages also allow holes or other openings to be placed in the back, sides, or bottom of the cabinet. These types of holes are frequently added to the cabinet design to provide adequate openings or clearances for utilities such as water pipes, drains, vents, electrical connections, etc.

If utilities that require clearance holes exist in the kitchen, the programmer using the software must determine the size and location of the holes on a particular cabinet design. They must then create a modification to the current cabinet design or create a new cabinet design that contains the required clearance holes. When these cabinets are later added to the kitchen design, the necessary clearance holes for utilities are in place.

Another common occurrence is an exposed pipe or other utility on the outside of a kitchen wall. To accommodate this pipe, the cabinets placed against that wall must be modified to provide clearance for this utility. This is commonly done by notching the sides of the cabinet box and, either moving the cabinet-back forward to provide clearance, or building a box around the pipe inside the cabinet. Again, using current technology, the programmer using the software must create a special cabinet that contains the modifications needed to allow for the exposed pipe.

Yet another requirement is to provide clearance holes through adjoining cabinet sides for the passage of utilities, pipes or electric lines. Common examples of this include connecting a microwave to a remote electrical outlet, connecting a garbage disposal to a dishwasher in an adjoining cabinet or running a water line through the sides of several cabinets to an icemaker in a refrigerator. Again, current technology requires that these clearance holes be added to each individual cabinet in the design process.

This approach has many disadvantages. It requires significant programming time to create the modified versions of existing cabinet designs. It requires a high skill level on the part of the programmer to determine the exact size and location of the clearance holes and errors are common. Once the modified cabinet design is placed in a kitchen layout, it cannot be moved or adjusted because the clearance holes will not be properly located. The modified cabinet design with the clearance holes will likely only be used once.

The present invention addresses these shortcomings and offers a method of adding clearance holes that is simple, accurate, fast and flexible.

SUMMARY OF THE INVENTION

The principal object of the present invention is to provide a method for locating utility openings and wall protrusions in kitchen cabinets during the design phase. Another object is to provide a method for automatically relocating utility openings and wall protrusions in the proper location when cabinets are moved within a kitchen layout during the design process.

The invention accomplishes these objects and overcomes the aforementioned problems by providing a method for designing a kitchen wherein the information relating to the location and clearance requirements for utility components and wall protrusions is inputted into a computer, the cabinets of the kitchen are then placed over the utility components and protrusions, and the computer automatically removes the clearances portions of the cabinets to accommodate the utility components and protrusions. If the user desires to view a different design of the same kitchen layout, the information relating to the utility locations and clearance requirements remain in the layout information. When different cabinets are placed over the utilities, the computer removes portions of the new cabinets to accommodate the utilities that remained in the layout. This allows the user to view several designs of the kitchen without having to re-input the information relating to the utilities and their associated clearances. Also, the method aids in preventing a designer from leaving out a utility clearance portion in a cabinet after several design changes.

BRIEF DESCRIPTION OF THE DRAWINGS

The above and other aspects, features and advantages of the present invention will be more apparent from the following detailed description of the preferred embodiment of the invention, presented in conjunction with the following drawings in which.

DETAILED DESCRIPTION OF THE PREFERRED EMBODIMENT

Utilities that are located on the wall of a building structure such as water pipes, drains, vents, and electrical outlets are accurately located using the software. The software also defines for each utility type, any necessary clearance hole through the back of a cabinet.

Figure 1:
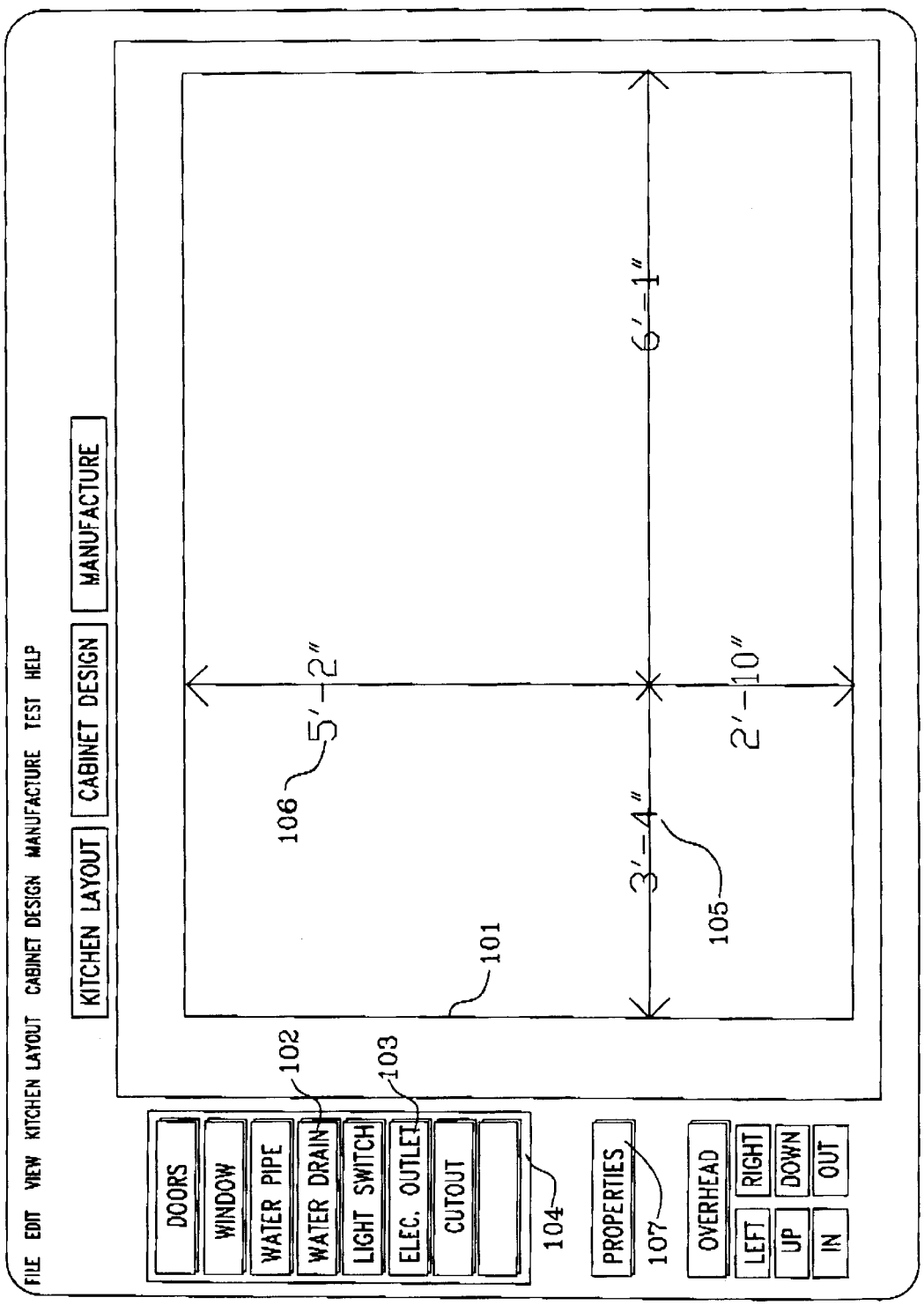
FIG. 1 illustrates a computer display for cabinet-design software showing various menu dialog boxes along with the working screen for cabinet layout and design.
Figure 2:
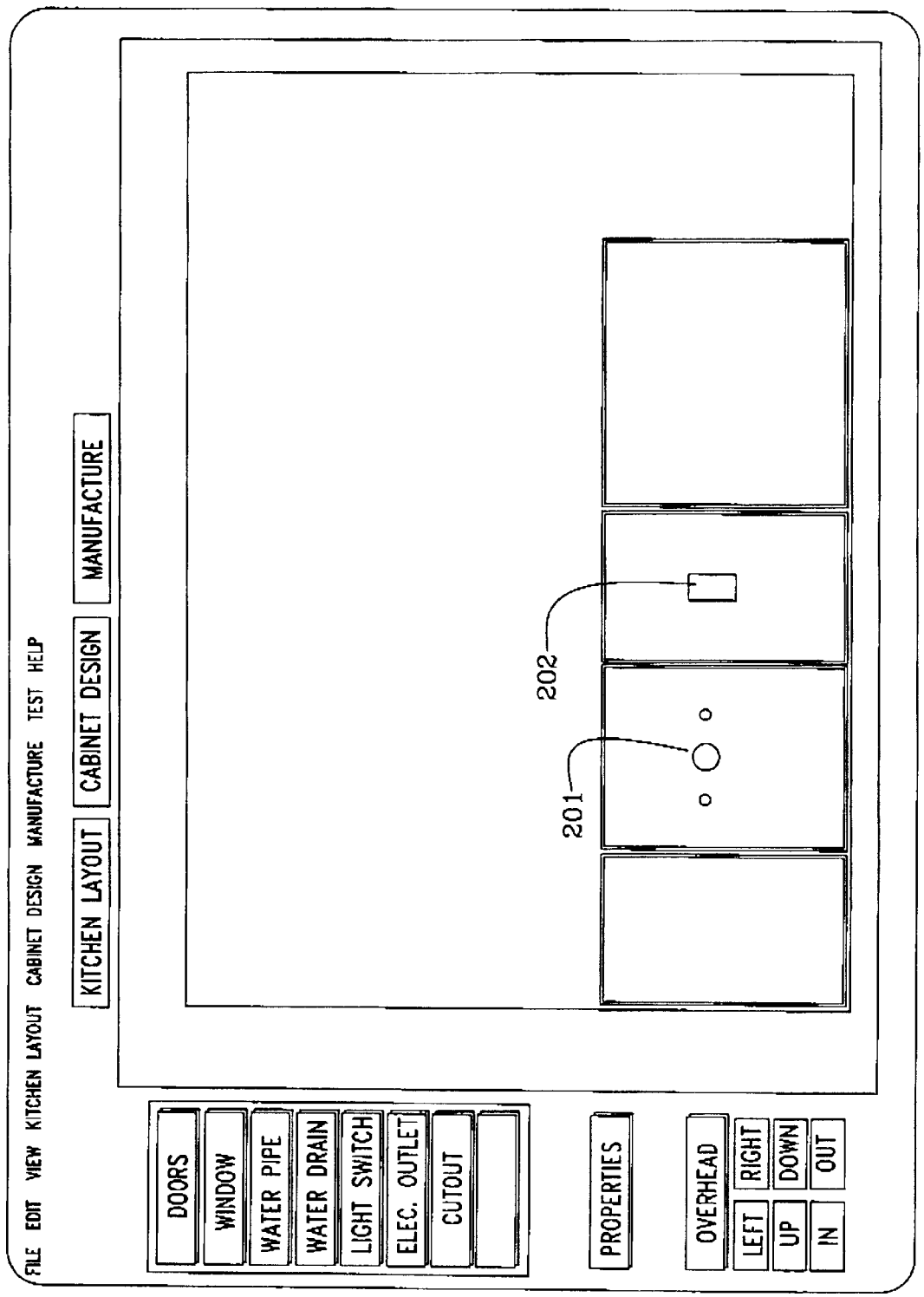
FIG. 2 is an illustration of the same screen showing a layout of kitchen cabinets superimposed over utility openings.

Referring to FIG. 1, the software operator begins the process of locating utility openings by selecting and dimensionally defining on the computer display screen, an elevation view of the wall 101 of the building structure onto which a cabinet or row of cabinets is to be placed. The location of the required utility opening is defined by selecting from an on-screen menu 104, the appropriate symbol such as a water drain 102 or an electrical outlet 103, then dragging it to the proper location on the screen. Real-time coordinate dimensions 105 and 106 of the centerline of the utility opening relative to the outside borders of the wall are displayed on the screen as the symbol is moved into position. The operator may as an alternative choose to pick the graphic symbol, and then type the coordinate locating dimensions into the computer. In either case, the operator, referring to provided architectural drawings, places the opening in the correct location on the wall. The size of the required opening is defined by selecting the "properties" dialog box 107 from the menu, then typing the required dimensions into the computer. A graphic overlay of a single cabinet or a row of cabinets may then be placed into position on the computer screen at the intended location on the wall over the defined utility opening. In FIG. 2, there is shown an example of the computer screen with an overlay of a row of cabinets placed over defined utility openings 201 and 202.

Pipe runs are handled by a similar method. A box of appropriate length and width representing a protrusion, is graphically defined on the wall so that the box completely encloses the exposed protrusion. When a cabinet design is placed over this box, its sides are notched to provide clearance for the box and, either its back panel is positioned forward to provide clearance or a box is constructed around it. If a cabinet is moved or substituted during the design process, the clearance holes remain in the same location on the wall and are automatically transferred to whichever cabinet is placed over them.

When the design is processed into cut-path geometry, the software will add the required clearance holes in the proper location on the appropriate cabinet panel. The necessary holes will be routed into the back panels of the cabinet or cabinets in their exact intended location on a CNC machining center. In addition, this approach can prevent the software user from locating a cabinet into a position that interferes with a utility, such as placing a cabinet wall over a water pipe.

Utility clearance holes through the sides of cabinets are handled in a slightly different manner. First, all of the cabinets are located within the kitchen layout. Then, the programmer creates a "link" between two or more cabinets. This link defines two different locations in different cabinets between which a clearance hole or passage is required. The size and shape of each clearance hole as well its location on the cabinet side is defined. The software then adds the required clearance hole at the defined location on all cabinet sides between the two locations that have been linked.

Figure 3:
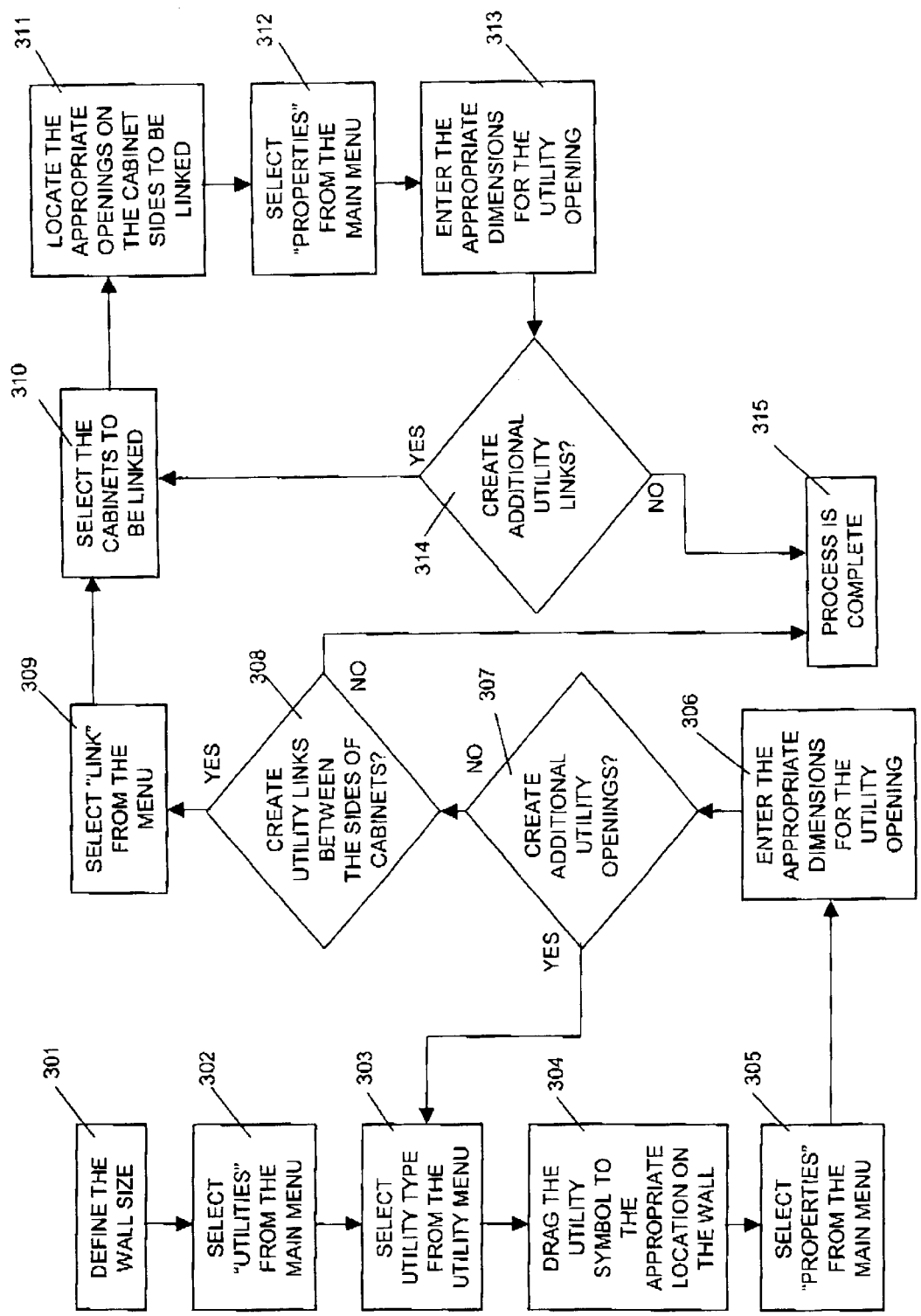
FIG. 3 is a flow chart relating the process of adding utility openings to a cabinet layout within a cabinet-design software system.

Referring to FIG. 3, there is provided a flow chart demonstrating the process of adding utility openings to a cabinet layout. A wall is first defined by selecting a wall type and inputting the appropriate dimension 301. The utility menu is then selected from the main menu 302. The type of utility is then selected from the utility menu 303. After the utility is selected, the corresponding symbol is dragged to the appropriate location on the wall 304 using a manual pointing device or "mouse". From the properties menu, the operator selects the appropriate dimension dialog box or boxes then enters either the height and width or the diameter of the opening, depending on the opening's shape 306. The operator continues the process if additional utility openings are required 307. The operator then makes a decision as to whether or not two or more cabinets need to be linked by utility openings in their sides 308. If a utility link between two or more cabinets is not necessary, the process is complete 315. If, however, the operator needs to create a utility link between two or more cabinets, the link menu is selected 309. The cabinets to be linked are selected 310, and the appropriate type of utility opening is located on the sides of the cabinets 311. "Properties" is selected from the menu 312 and the appropriate dimensions for the utility opening is entered 313. Additional links are created as needed 314. After all necessary links are complete the process is finished 315.

The approach described herein is uncomplicated and works well with actual construction techniques. Adjustments to the design can still be made without disturbing the alignment between utilities and clearance holes in the cabinets. The operator is not required to produce special cabinet designs that will only be used once.

From the foregoing detailed description, it will be evident that there are a number of changes, adaptations and modifications of the present invention, which come within the province of those persons having ordinary skill in the art to which the aforementioned invention pertains. However, it is intended that all such variations not departing from the spirit of the invention be considered as within the scope thereof as limited solely by the appended claims.

I claim:

1. A system for aiding the layout of at least one unit, comprising:

a screen for displaying a representation of a wall, a base file for storing information concerning the location of and a configuration to accommodate for a protrusion in relation to said wall, which includes information relating to the type of utility corresponding to said protrusion and a correct clearance size based on the type of utility, a working file for storing data concerning the location and configuration of a unit in relation to said wall, and a means to control that displays the unit on said screen and automatically modifies the information stored in the working file on the basis of the information stored in the base file upon a change in the information stored in the working file.

2. The system according to claim 1, further comprising a means to input information in the working file.

3. The system according to claim 2, wherein said means to input comprises a keyboard for entering the coordinates of the location of the protrusion.

4. The system according to claim 2, wherein said means to input comprises a pointer capable of being dragged on the computer screen.

5. The system according to claim 4, wherein said screen displays real time coordinates of the pointer in relation to the wall.

6. In the computer aided layout of at least one unit to be positioned against or adjacent a wall structure, a method of providing for at least one protrusion of a wall structure, comprising:

a) defining a wall structure for which a unit will be placed, b) identifying the location of said protrusion on said wall structure, c) identifying a configuration to accommodate said protrusion, including selecting a type of utility for the protrusion and determining a correct clearance size and shape based on the type of utility, d) selecting and displaying a representation of a design of said unit on a screen, e) placing said unit in a desired position in relation to said wall, f) modifying the design of said unit based on said configuration for said protrusion, and g) repeating step (f) upon a reselecting or relocating of said unit.

7. The method according to claim 6, wherein modifying the design of said unit comprises removing portions of said unit.

8. The method according to claim 6, wherein identifying the location of said protrusion includes entering coordinates corresponding to said location of said protrusion in relation to said wall structure.

9. The method according to claim 6, wherein identifying the location of said protrusion includes dragging a pointer on a computer screen.

10. The method according to claim 9, wherein said computer screen displays real-time coordinates corresponding to a position of said pointer in relation to said wall.

11. The method according to claim 6, wherein identifying the location of said protrusion includes entering the coordinates of a first and second location in relation to said wall for which said protrusion passes.

12. The method according to claim 11, wherein identifying the location of said protrusion includes entering a path for said protrusion between said first and second locations.

13. The method according to claim 6, including storing data in a base file of a memory of said computer corresponding to said wall, said protrusion location and said clearance for said protrusion, and transferring data from said base file to said working file to modify the design of said unit corresponding to said clearance size for said protrusion.

14. The method according to claim 13, wherein modifying the design of said unit comprises removing portions of said unit.

15. The system according to claim 1, wherein the information stored in the working file is modified by removing those portions of the unit corresponding to the location and configuration to accommodate for the protrusion.

16. The system according to claim 1, wherein the information concerning the location of the protrusion includes coordinates corresponding to the location of said protrusion in relation to the wall.

17. The system according to claim 1, wherein the information concerning the location of the protrusion includes coordinates corresponding to a first and second location in relation to said wall for which the protrusion passes.

18. The system according to claim 17, wherein the information further includes a path between said first and second locations corresponding to the protrusion.

* * * * *